(12) United States Patent
Ito et al.

(10) Patent No.: US 11,374,097 B2
(45) Date of Patent: Jun. 28, 2022

(54) SEMICONDUCTOR DEVICE HAVING IMPROVED CARRIER MOBILITY

(71) Applicant: KABUSHIKI KAISHA TOSHIBA, Minato-ku (JP)

(72) Inventors: Kazuyuki Ito, Kamakura (JP); Tatsuhiro Oda, Yokohama (JP); Takuo Kikuchi, Kamakura (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 17/008,960

(22) Filed: Sep. 1, 2020

(65) Prior Publication Data

US 2021/0091188 A1    Mar. 25, 2021

(30) Foreign Application Priority Data

Sep. 24, 2019    (JP) .............................. JP2019-172938

(51) Int. Cl.
*H01L 29/40* (2006.01)
*H01L 29/78* (2006.01)
*H01L 29/06* (2006.01)

(52) U.S. Cl.
CPC ........ *H01L 29/407* (2013.01); *H01L 29/0696* (2013.01); *H01L 29/7827* (2013.01)

(58) Field of Classification Search
CPC .............. H01L 29/407; H01L 29/7827; H01L 29/0696; H01L 29/7843; H01L 29/66727; H01L 29/66734; H01L 29/0649; H01L 29/41766; H01L 29/1095; H01L 29/7813; H01L 29/0684; H01L 29/1037

USPC ......................................................... 257/409
See application file for complete search history.

(56) References Cited

U.S. PATENT DOCUMENTS

| | | | | |
|---|---|---|---|---|
| 10,128,368 B2 * | 11/2018 | Li | ..................... | H01L 29/66734 |
| 10,192,960 B2 * | 1/2019 | Wada | ................... | H01L 29/7811 |
| 10,903,163 B2 * | 1/2021 | Guan | ................ | H01L 29/66734 |
| 11,031,478 B2 * | 6/2021 | Huang | .............. | H01L 29/41741 |

(Continued)

FOREIGN PATENT DOCUMENTS

| JP | 2013-065590 A | 4/2013 |
|---|---|---|
| JP | 2013-187482 A | 9/2013 |
| JP | 2015-053308 A | 9/2015 |

*Primary Examiner* — Mohammad M Hoque
(74) *Attorney, Agent, or Firm* — Oblon, McClelland, Maier & Neustadt, L.L.P.

(57) ABSTRACT

According to one embodiment, a semiconductor device includes first to third electrodes, first to third semiconductor regions, first and second insulating parts, and a gate electrode. The first semiconductor region is provided on the first electrode. The second semiconductor region is provided on the first semiconductor region. The third semiconductor regions are provided selectively on the second semiconductor region. The first insulating part is arranged with the third and second semiconductor regions, and a portion of the first semiconductor region. The second electrode is provided inside the first insulating part. The gate electrode is provided inside the first insulating part and electrically isolated from the second electrode. The third electrode is provided on the second and third semiconductor regions. The third electrode includes a contact part provided between the third semiconductor regions. The second insulating part is provided between the first semiconductor region and the contact part.

13 Claims, 16 Drawing Sheets

(56) References Cited

U.S. PATENT DOCUMENTS

| | | | |
|---|---|---|---|
| 2010/0078707 A1* | 4/2010 | Haeberlen | H01L 29/7803 438/270 |
| 2013/0313576 A1* | 11/2013 | Nakano | H01L 21/02178 257/77 |
| 2015/0137223 A1* | 5/2015 | Siemieniec | H01L 29/7813 257/331 |
| 2015/0214355 A1* | 7/2015 | Nakano | H01L 29/7813 257/330 |

* cited by examiner

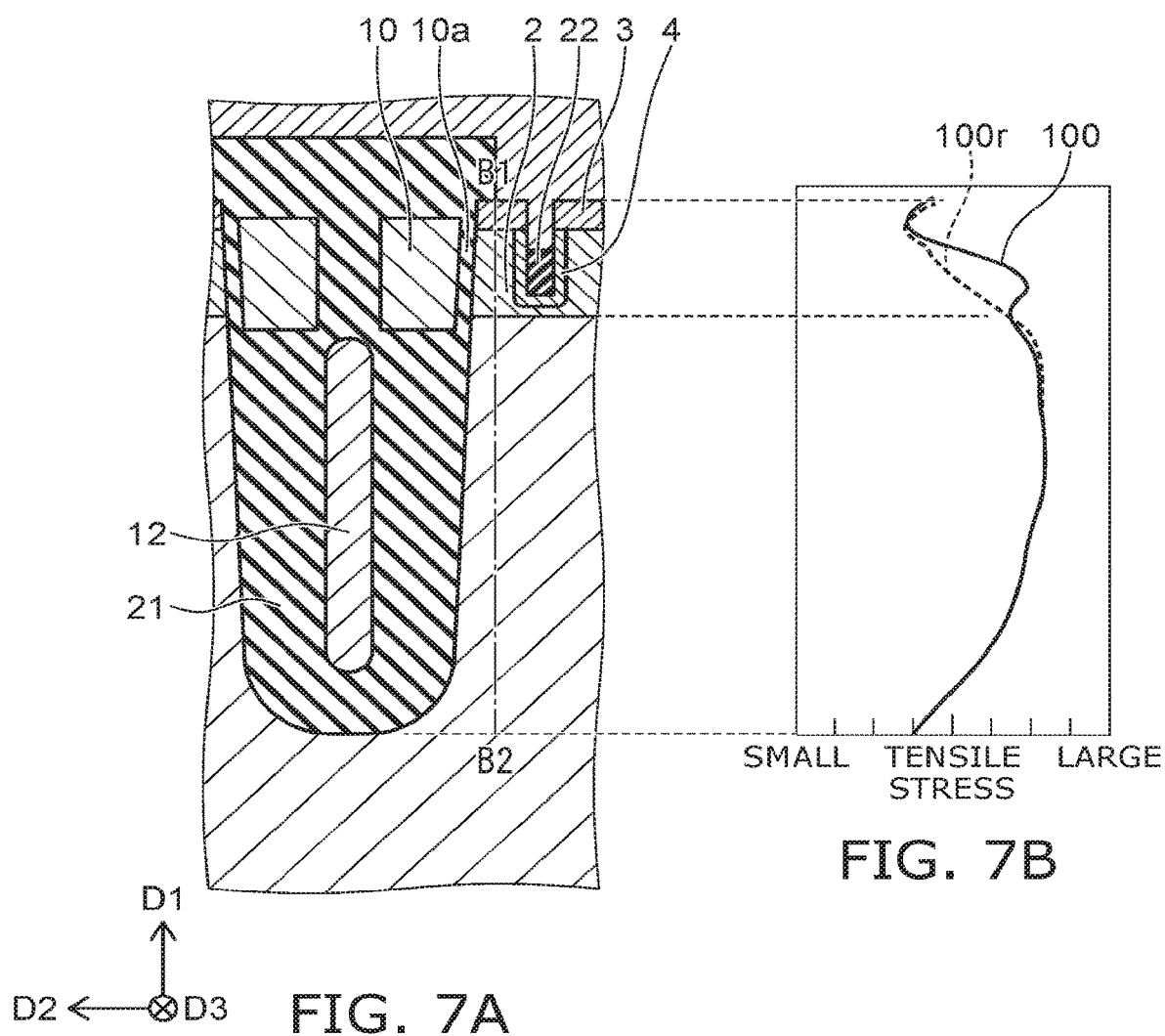

SEMICONDUCTOR DEVICE HAVING IMPROVED CARRIER MOBILITY

CROSS-REFERENCE TO RELATED APPLICATIONS

This application is based upon and claims the benefit of priority from Japanese Patent Application No. 2019-172938, filed on Sep. 24, 2019; the entire contents of which are incorporated herein by reference.

FIELD

Embodiments described herein relate generally to a semiconductor device.

BACKGROUND

There is a semiconductor device that includes a field plate electrode (called the FP electrode hereinbelow) for reducing the ON-resistance. It is desirable to further reduce the ON-resistance of the semiconductor device.

BRIEF DESCRIPTION OF THE DRAWINGS

FIG. 7A is a cross-sectional view illustrating a portion of the semiconductor device according to the embodiment, FIG. 7B is a graph illustrating characteristics of the semiconductor devices according to the embodiment and a reference example;

DETAILED DESCRIPTION

Figure 1:
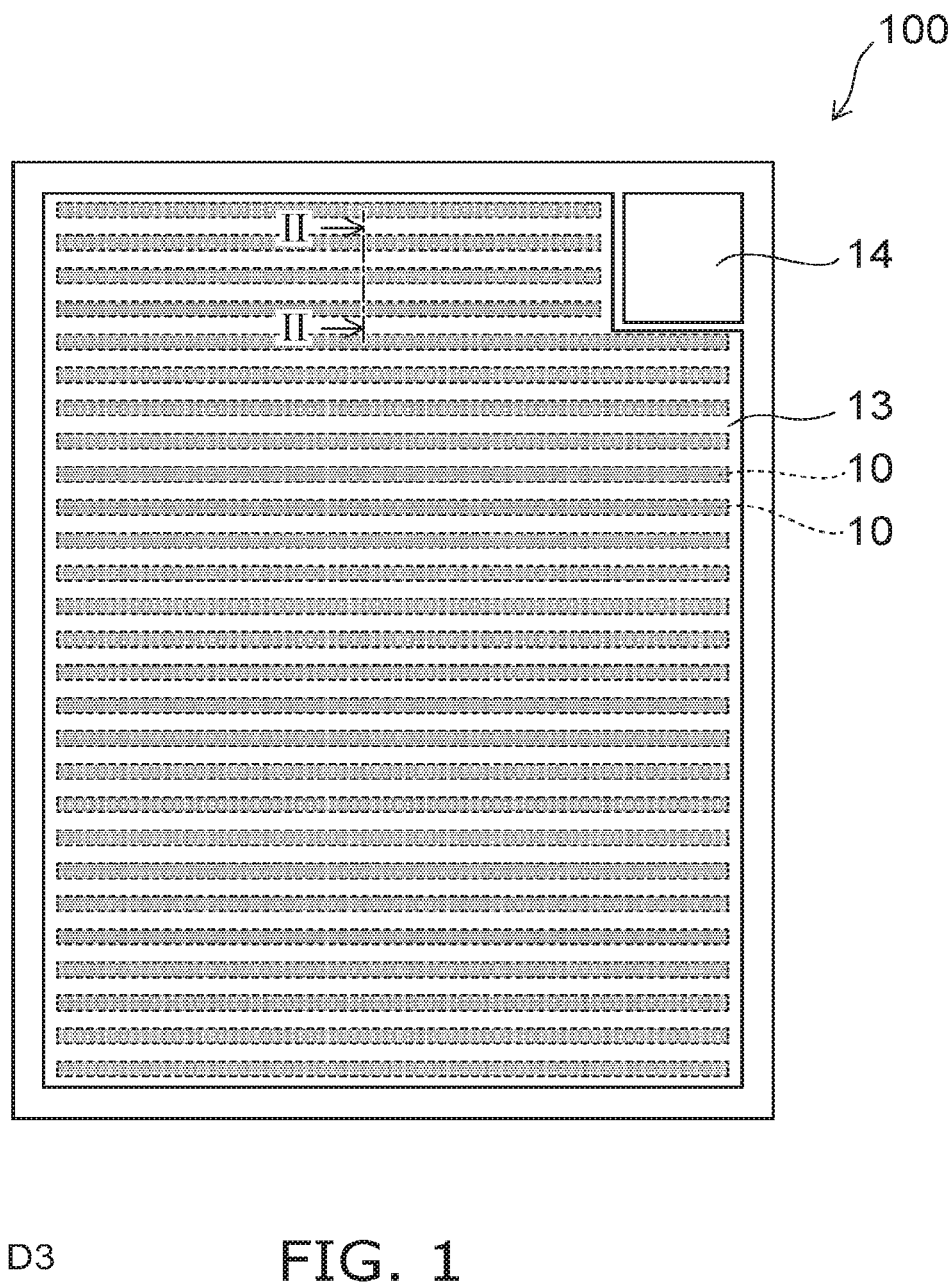
FIG. 1 is a plan view illustrating a semiconductor device according to a first embodiment.

According to one embodiment, a semiconductor device includes a first electrode, a first semiconductor region of a first conductivity type, a second semiconductor region of a second conductivity type, a plurality of third semiconductor regions of the first conductivity type, a first insulating part, a second electrode, a gate electrode, a third electrode, and a second insulating part. The first semiconductor region is provided on the first electrode. The second semiconductor region is provided on the first semiconductor region. The third semiconductor regions are provided selectively on the second semiconductor region. The first insulating part is arranged in a second direction with the third semiconductor region, the second semiconductor region, and a portion of the first semiconductor region. The second direction is perpendicular to a first direction. The first direction is from the first electrode toward the first semiconductor region. The second electrode is provided inside the first insulating part. The second electrode includes a portion opposing the first semiconductor region in the second direction. The gate electrode is provided inside the first insulating part and electrically isolated from the second electrode. The gate electrode opposes the second semiconductor region in the second direction. The third electrode is provided on the second semiconductor region and the third semiconductor regions and electrically connected to the second semiconductor region, the third semiconductor regions, and the second electrode. The third electrode includes a contact part provided between the third semiconductor regions in the second direction. The second insulating part is provided between the first semiconductor region and the contact part in the first direction and arranged with the gate electrode in the second direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the drawings and the description recited below, the notations of $n^+$, $n^-$, $p^+$, and p indicate relative levels of the impurity concentrations. In other words, a notation marked with "+" indicates that the impurity concentration is relatively higher than that of a notation not marked with either "+" or "−", and a notation marked with "−" indicates that the impurity concentration is relatively lower than that of a notation without any mark. In the case where both a p-type impurity and an n-type impurity are included in each region, these notations indicate relative levels of the net impurity concentrations after the impurities are compensated.

In the embodiments described below, each embodiment may be implemented by inverting the p-type and the n-type of each semiconductor region.

First Embodiment

FIG. 1 is a plan view illustrating a semiconductor device according to a first embodiment.

Figure 2:
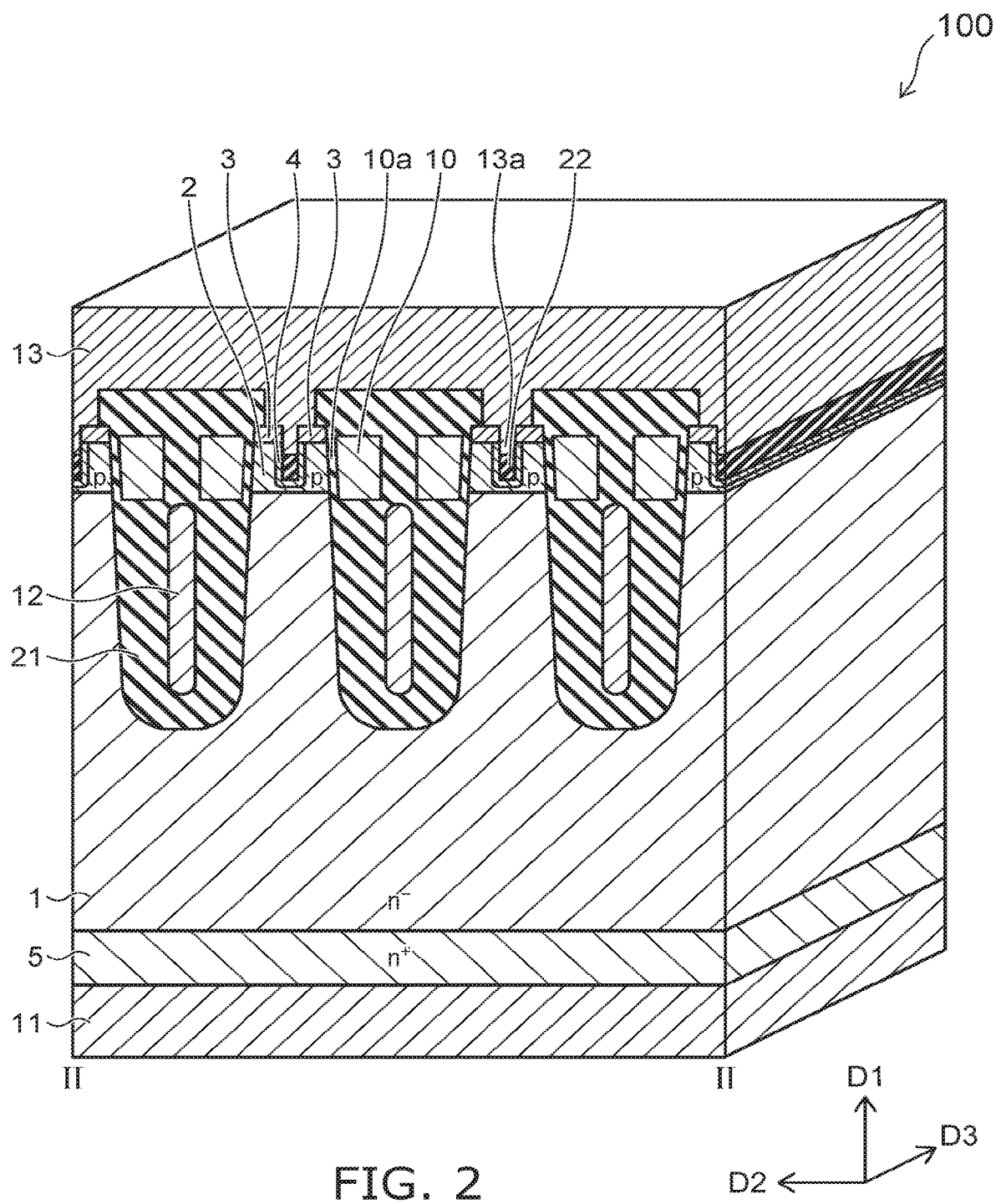
FIG. 2 is a perspective cross-sectional view including a II-II cross section of FIG. 1.

FIG. 2 is a perspective cross-sectional view including a II-II cross section of FIG. 1.

The semiconductor device according to the first embodiment is, for example, a Metal Oxide Semiconductor Field Effect Transistor (MOSFET). As illustrated in FIG. 1 and FIG. 2, the semiconductor device 100 according to the first embodiment includes an n⁻-type (first conductivity-type) drift region 1 (a first semiconductor region), a p-type (second conductivity-type) base region 2 (a second semiconductor region), an n⁺-type source region 3 (a third semiconductor region), an n⁺-type drain region 5, a gate electrode 10, a drain electrode 11 (a first electrode), a FP electrode 12 (a second electrode), a source electrode 13 (a third electrode), a gate pad 14, a first insulating part 21, and a second insulating part 22.

A first direction D1, a second direction D2, and a third direction D3 are used in the description of the following embodiments. The direction from the drain electrode 11 toward the n⁻-type drift region 1 is taken as the first direction D1. One direction perpendicular to the first direction D1 is taken as the second direction D2. A direction that is perpendicular to the first direction D1 and crosses the second direction D2 is taken as the third direction D3. Also, in the description, the direction from the drain electrode 11 toward the n⁻-type drift region 1 is called "up", and the reverse direction is called "down". These directions are based on the relative positional relationship between the drain electrode 11 and the n⁻-type drift region 1 and are independent of the direction of gravity.

As illustrated in FIG. 1, the source electrode 13 and the gate pad 14 are provided at the upper surface of the semiconductor device 100. The source electrode 13 and the gate pad 14 are electrically isolated from each other. In FIG. 1, the gate electrode 10 that is provided under the source electrode 13 is illustrated by dots. As illustrated in FIG. 1, multiple gate electrodes 10 are provided in the second direction D2, and the gate electrodes 10 extend in the third direction D3. In the example, the third direction D3 is perpendicular to the second direction D2.

As illustrated in FIG. 2, the drain electrode 11 is provided at the lower surface of the semiconductor device 100. The n⁻-type drift region 1 is provided on the drain electrode 11 with the n⁺-type drain region 5 interposed. The n⁻-type drift region 1 is electrically connected to the drain electrode 11 via the n⁺-type drain region 5. The p-type base region 2 is provided on the n⁻-type drift region 1. The multiple n⁺-type source regions 3 are selectively provided on the p-type base region 2. The multiple n⁺-type source regions 3 are separated from each other in the second direction D2.

The first insulating part 21 is arranged in the second direction D2 with the n⁺-type source region 3, the p-type base region 2, and a portion of the n⁻-type drift region 1. The gate electrode 10 and the FP electrode 12 are provided in the first insulating part 21. The FP electrode 12 opposes the n⁻-type drift region 1 in the second direction D2. The gate electrode 10 opposes the p-type base region 2 in the second direction D2 via a gate insulating layer 10a which is a portion of the first insulating part 21. In the semiconductor device 100, the gate electrode 10 also opposes the n⁻-type drift region 1 and the n⁺-type source region 3 via the gate insulating layer 10a. A portion of the first insulating part 21 is provided between the gate electrode 10 and the FP electrode 12. Thereby, the gate electrode 10 and the FP electrode 12 are electrically isolated from each other.

The source electrode 13 is provided on the p-type base region 2, the multiple n⁺-type source regions 3, and the gate electrode 10. The source electrode 13 includes a contact part 13a provided between the n⁺-type source regions 3 in the second direction D2. The p-type base region 2 and the multiple n⁺-type source regions 3 are connected to the source electrode 13 via the contact part 13a. The source electrode 13 also is electrically connected to the FP electrode 12 by a not-illustrated connector. The gate electrode 10 is electrically isolated from the source electrode 13 and electrically connected to the gate pad 14.

The second insulating part 22 is provided between the n⁻-type drift region 1 and the contact part 13a in the first direction D1. For example, the second insulating part 22 contacts the contact part 13a in the first direction D1. At least a portion of the p-type base region 2 is positioned between the gate electrode 10 and the second insulating part 22 in the second direction D2.

In the semiconductor device 100, a p⁺-type contact region 4 (a fourth semiconductor region) is provided between the p-type base region 2 and the second insulating part 22 and between the p-type base region 2 and the contact part 13a. The p-type impurity concentration in the p⁺-type contact region 4 is greater than the p-type impurity concentration in the p-type base region 2. The contact part 13a contacts the n⁺-type source region 3 and the p⁺-type contact region 4, and the p-type base region 2 is connected to the source electrode 13 via the p⁺-type contact region 4.

For example, a plurality is provided in the second direction D2 for each of the p-type base region 2, the pair of n⁺-type source regions 3, the p⁺-type contact region 4, the gate electrode 10, the FP electrode 12, the first insulating part 21, and the second insulating part 22; and the pluralities extend in the third direction D3. The p-type base region 2, the pair of n⁺-type source regions 3, the p⁺-type contact region 4, and the second insulating part 22 are provided between the first insulating parts 21 next to each other in the second direction D2. For example, the end portion in the third direction D3 of each of the FP electrodes 12 is drawn up toward the source electrode 13 outward of the gate electrode 10 and contacts the source electrode 13.

Operations of the semiconductor device 100 will now be described.

A voltage that is not less than a threshold is applied to the gate electrode 10 in a state in which a voltage that is positive with respect to the source electrode 13 is applied to the drain electrode 11. Thereby, a channel (an inversion layer) is formed in the p-type base region 2, and the semiconductor device 100 is set to the ON-state. Electrons pass through the channel and flow from the source electrode 13 toward the drain electrode 11. Subsequently, when the voltage that is applied to the gate electrode 10 becomes lower than the threshold, the channel in the p-type base region 2 disappears, and the semiconductor device 100 is set to the OFF-state.

When the semiconductor device 100 is switched to the OFF-state, the voltage that is applied to the drain electrode 11 and is positive with respect to the source electrode 13 increases. In other words, the potential difference between the n⁻-type drift region 1 and the FP electrode 12 increases. Due to the increase of the potential difference, a depletion layer spreads from the interface between the first insulating part 21 and the n⁻-type drift region 1 toward the n⁻-type drift region 1. The breakdown voltage of the semiconductor device 100 can be increased by the spreading of the depletion layer. Or, the ON-resistance of the semiconductor device 100 can be reduced by increasing the n-type impurity concentration in the n⁻-type drift region 1 while maintaining the breakdown voltage of the semiconductor device 100.

Examples of the materials of the components of the semiconductor device 100 will now be described.

The n⁻-type drift region 1, the p-type base region 2, the n⁺-type source region 3, the p⁺-type contact region 4, and the n⁺-type drain region 5 include silicon, silicon carbide, gallium nitride, or gallium arsenide as semiconductor materials. In the case where silicon is used as the semiconductor material, arsenic, phosphorus, or antimony can be used as the n-type impurity. Boron can be used as the p-type impurity.

The gate electrode 10 and the FP electrode 12 include a conductive material such as polysilicon, etc. An impurity may be added to the conductive material.

The first insulating part 21 and the second insulating part include insulating materials. For example, the first insulating part 21 includes silicon oxide or silicon nitride. It is favorable for the second insulating part 22 to include an oxide such as silicon oxide or aluminum oxide as the insulating material. The second insulating part 22 may include silicon nitride. The second insulating part 22 may include an oxynitride. The second insulating part 22 may include a stacked film of an oxide and a nitride.

The drain electrode 11, the source electrode 13, and the gate pad 14 include a metal such as aluminum, copper, etc.

An example of a method for manufacturing the semiconductor device 100 according to the first embodiment will now be described.

FIG. 3A to FIG. 6B are process cross-sectional views illustrating manufacturing processes of the semiconductor device according to the first embodiment. FIG. 3A to FIG. 6B illustrate the manufacturing processes in a cross section parallel to the first direction D1 and the second direction D2.

Figure 3A:
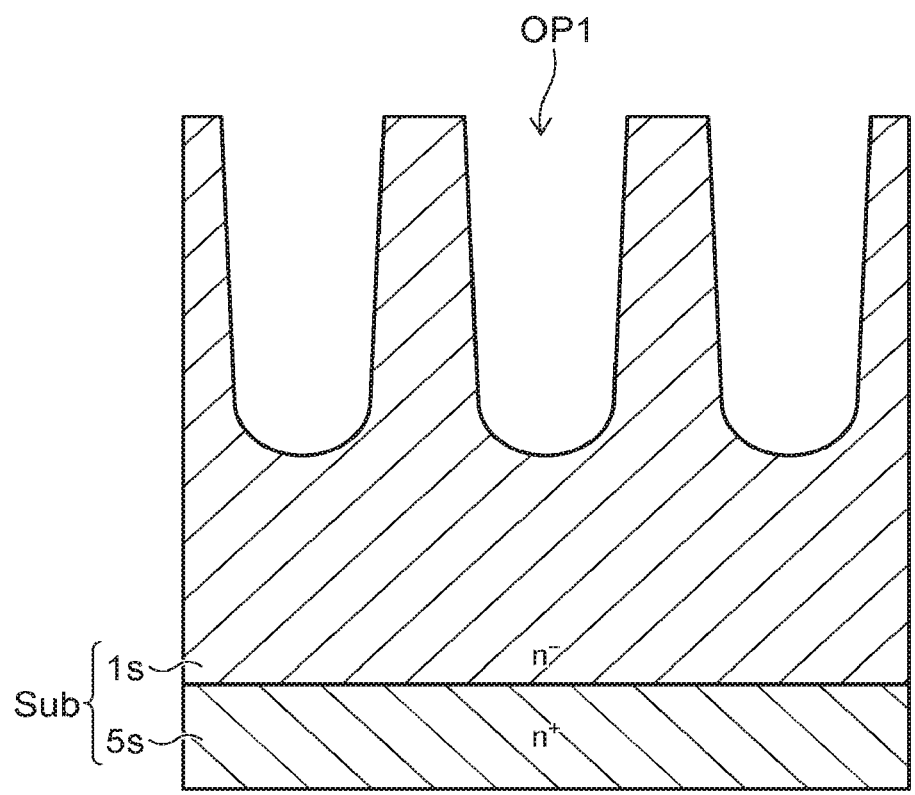
FIG. 3A and FIG. 3B are process cross-sectional views illustrating manufacturing processes of the semiconductor device according to the first embodiment.

A semiconductor substrate Sub that includes an n$^+$-type semiconductor layer 5s and an n$^-$-type semiconductor layer 1s is prepared. As illustrated in FIG. 3A, an opening OP1 is formed in the upper surface of the n$^-$-type semiconductor layer 1s. Multiple openings OP1 are formed in the second direction D2, and the openings OP1 extend in the third direction D3.

Figure 3B:
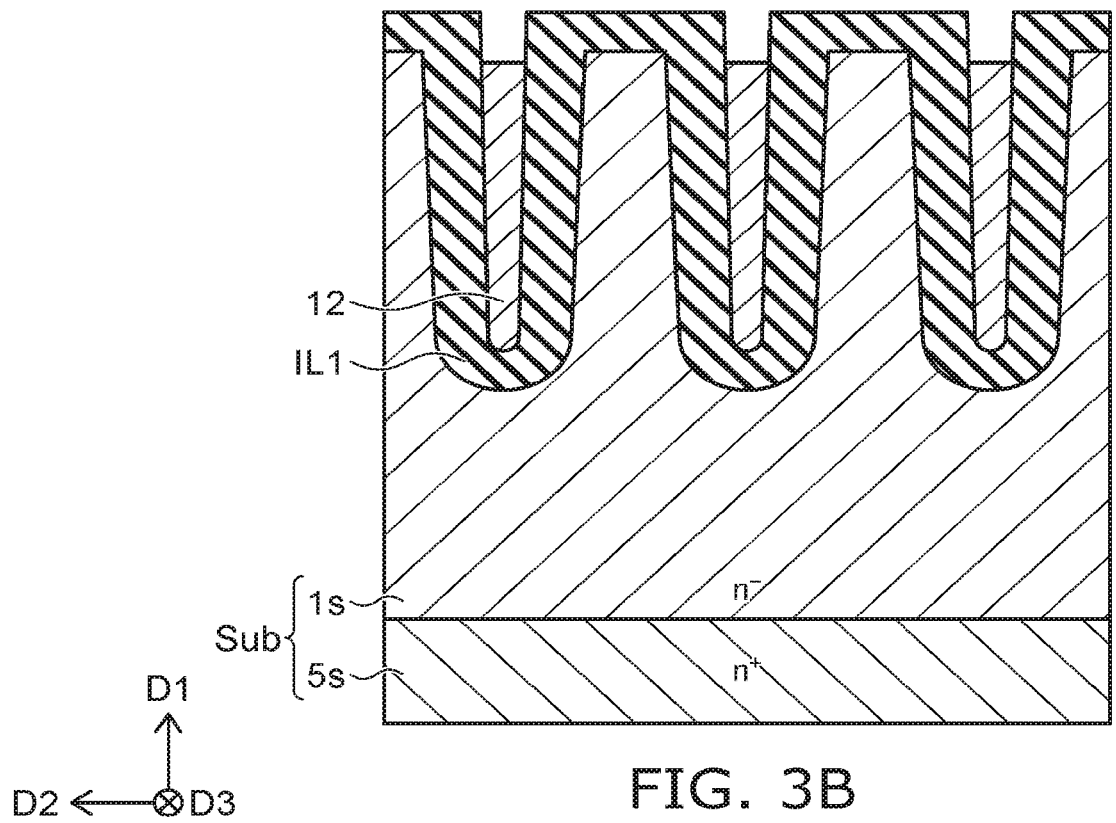

An insulating layer IL1 is formed by thermal oxidation along the inner surfaces of the openings OP1 and the upper surface of the n$^-$-type semiconductor layer 1s. A conductive layer that fills the multiple openings OP1 is formed on the insulating layer IL1. For example, the conductive layer includes polysilicon to which an impurity is added. As illustrated in FIG. 3B, the FP electrodes 12 are formed inside the openings OP1 by causing the upper surface of the conductive layer to recede.

Figure 4A:
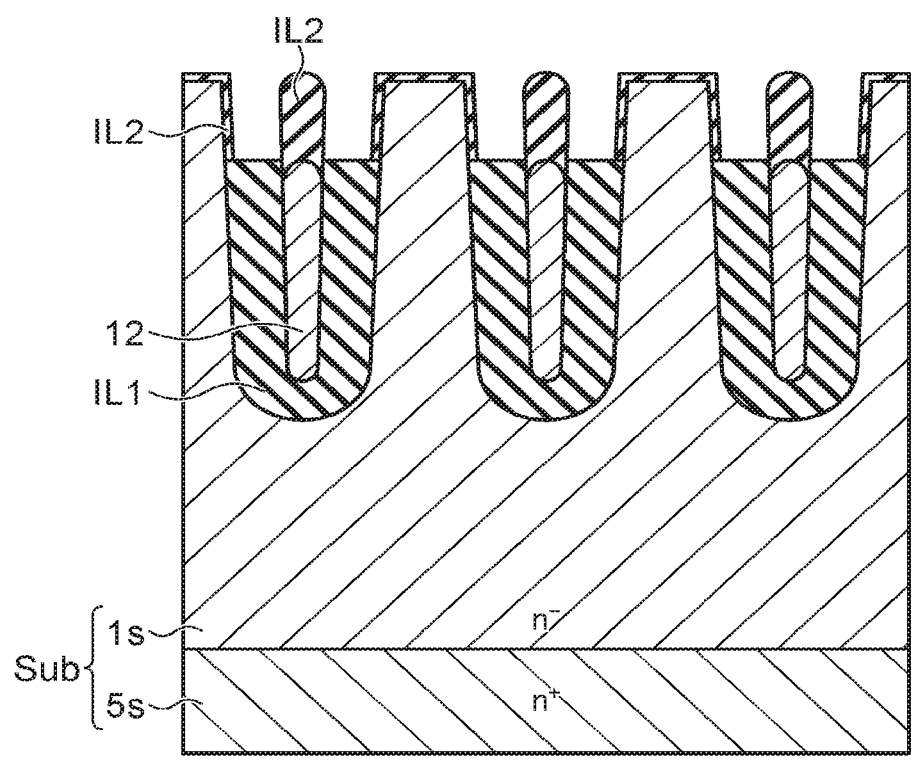
FIG. 4A and FIG. 4B are process cross-sectional views illustrating manufacturing processes of the semiconductor device according to the first embodiment.

The upper surface of the insulating layer IL1 is caused to recede so that the position of the upper surface of the insulating layer IL1 is lower than the positions of the upper surfaces of the FP electrodes 12. As illustrated in FIG. 4A, an insulating layer IL2 is formed at the inner surfaces of the openings OP1, the upper surface of the n$^-$-type semiconductor layer 1s, and the upper portions of the FP electrodes 12 by thermal oxidation. The exposed upper portions of the FP electrodes 12 also are oxidized at this time. By adding the impurity to the FP electrodes 12, the oxidation rate of the upper portions of the FP electrodes 12 becomes faster than the oxidation rate of the n$^-$-type semiconductor layer 1s. As a result, for example, the entire exposed upper portions of the FP electrodes 12 are oxidized.

Figure 4B:
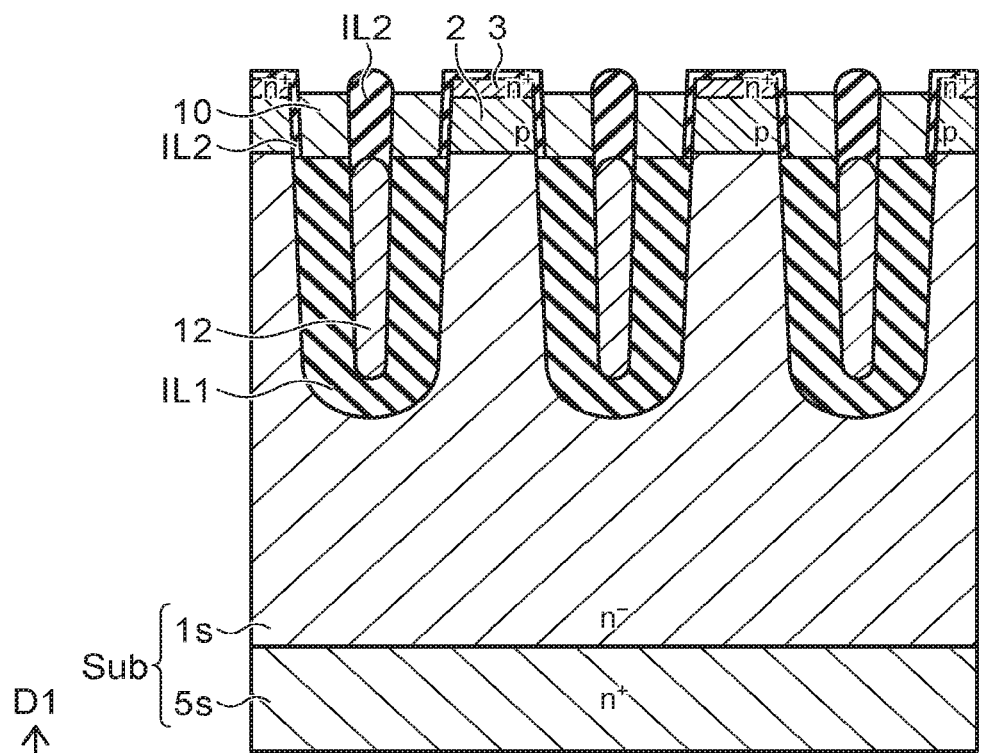

A conductive layer that fills the multiple openings OP1 is formed on the insulating layers IL1 and IL2. For example, the conductive layer includes polysilicon to which an impurity is added. The gate electrodes 10 are formed inside the openings OP1 by causing the upper surface of the conductive layer to recede. The p-type base region 2 is formed by ion-implanting a p-type impurity into the front surface of the n$^-$-type semiconductor layer 1s. At this time, the lower end of the gate electrode 10 is positioned lower than the interface between the n$^-$-type semiconductor layer 1s and the p-type base region 2. As illustrated in FIG. 4B, the n$^+$-type source region 3 is formed by ion-implanting an n-type impurity into the front surface of the p-type base region 2.

Figure 5A:
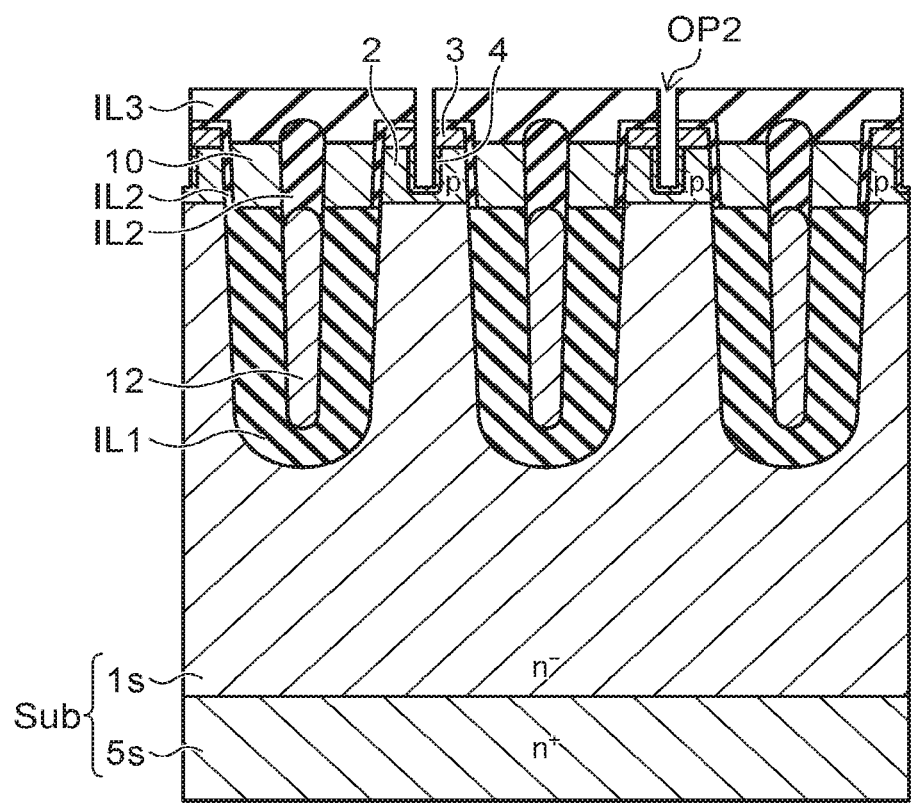
FIG. 5A and FIG. 5B are process cross-sectional views illustrating manufacturing processes of the semiconductor device according to the first embodiment.

An insulating layer IL3 that covers the multiple gate electrodes 10 is formed on the insulating layer IL2. Openings OP2 that reach the p-type base regions 2 are formed by removing portions of the insulating layer IL3, the insulating layer IL2, the n$^+$-type source regions 3, and the p-type base regions 2. As illustrated in FIG. 5A, the multiple p$^+$-type contact regions 4 are formed by ion-implanting a p-type impurity into the multiple p-type base regions 2 via the multiple openings OP2.

Figure 5B:
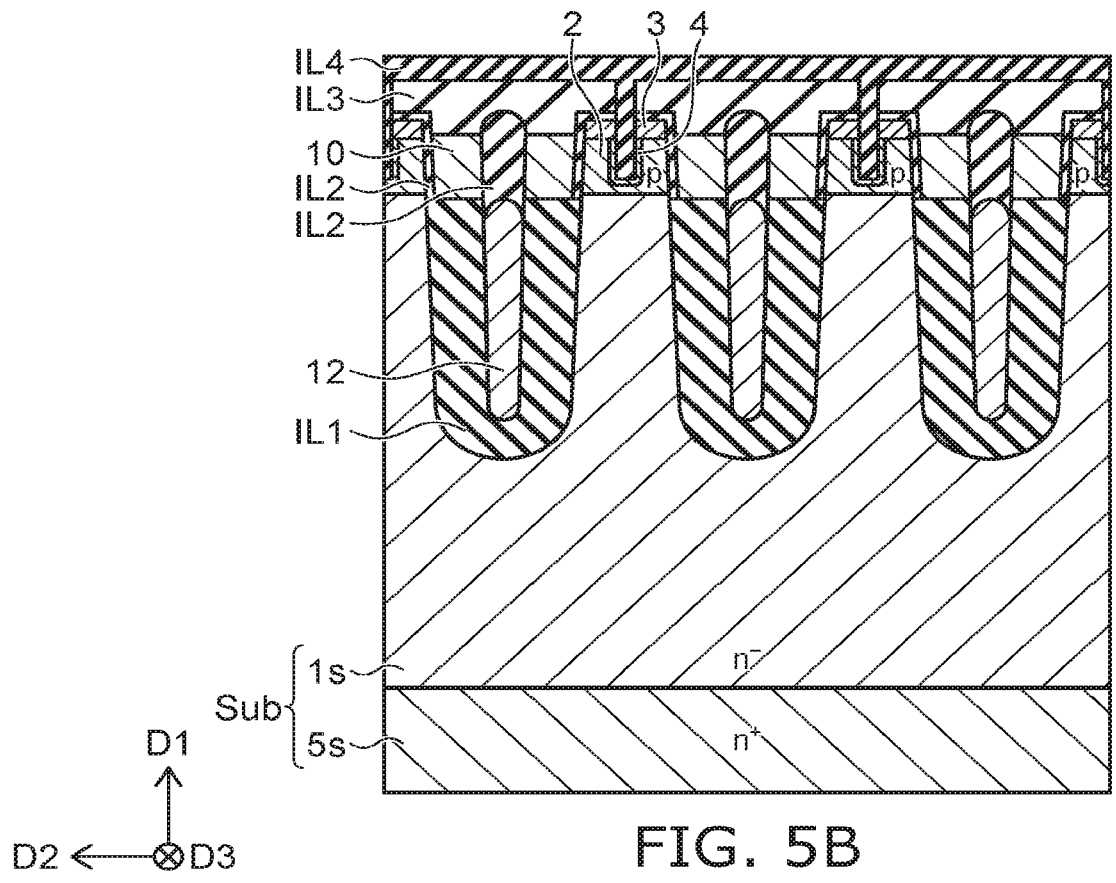
Figure 6A:
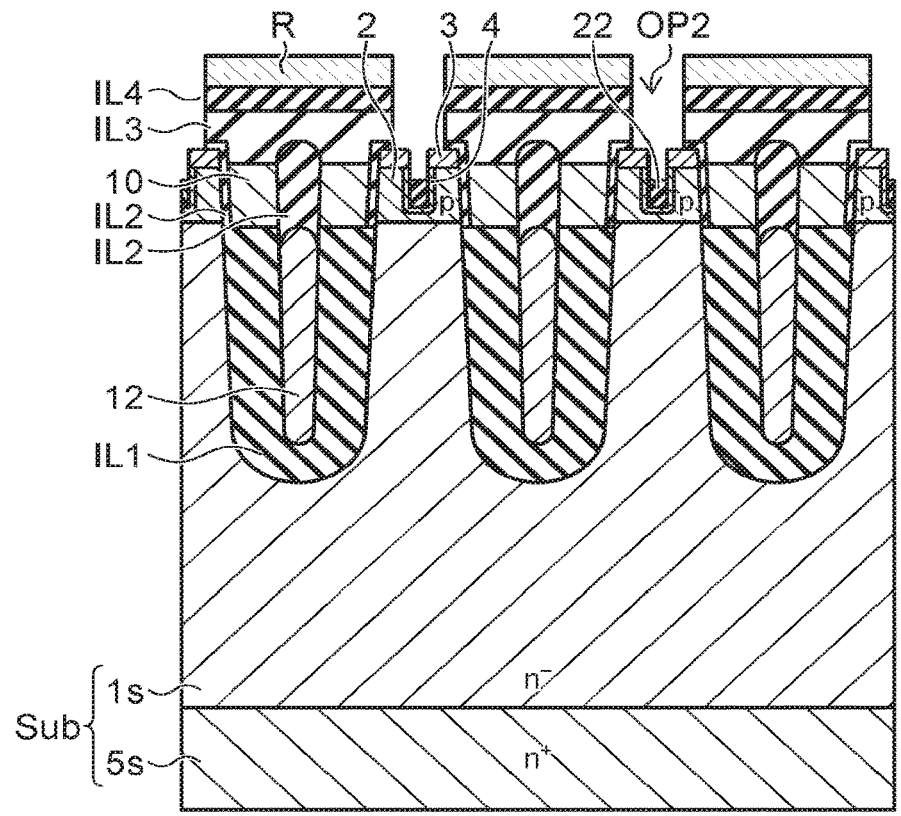
FIG. 6A and FIG. 6B are process cross-sectional views illustrating manufacturing processes of the semiconductor device according to the first embodiment.

As illustrated in FIG. 5B, the openings OP2 are filled by forming an insulating layer IL4 on the insulating layer IL3. The insulating layer IL4 is formed by chemical vapor deposition (CVD) of an oxide such as silicon oxide, etc. A resist R that is patterned by photolithography is formed on the insulating layer IL4. The resist R has openings at the positions where the openings OP2 exist. The insulating layer IL4 that is provided in the openings OP2 is removed by anisotropic etching using the resist R as a mask. At this time, as illustrated in FIG. 6A, a portion of the insulating layer IL4 is removed so that the insulating layer IL4 remains at the bottom portions of the openings OP2. The insulating layer IL4 that remains at the bottom portions of the openings OP2 corresponds to the second insulating parts 22.

Or, the insulating layer IL4 may be formed by thermal oxidation of the surfaces of the p-type base region 2, the n$^+$-type source region 3, and the p$^+$-type contact region 4 exposed via the openings OP2. In such a case, the insulating layer IL4 is formed only at the bottom portions of the openings OP2. The structure illustrated in FIG. 6A is obtained by causing the upper surface of the insulating layer IL4 to recede by anisotropic etching or isotropic etching.

The insulating layer IL4 may be formed by depositing silicon nitride by using CVD. For example, the silicon nitride is deposited by catalyst CVD using monosilane (SiH$_4$), ammonia (NH$_3$), and nitrogen (N$_2$).

Figure 6B:
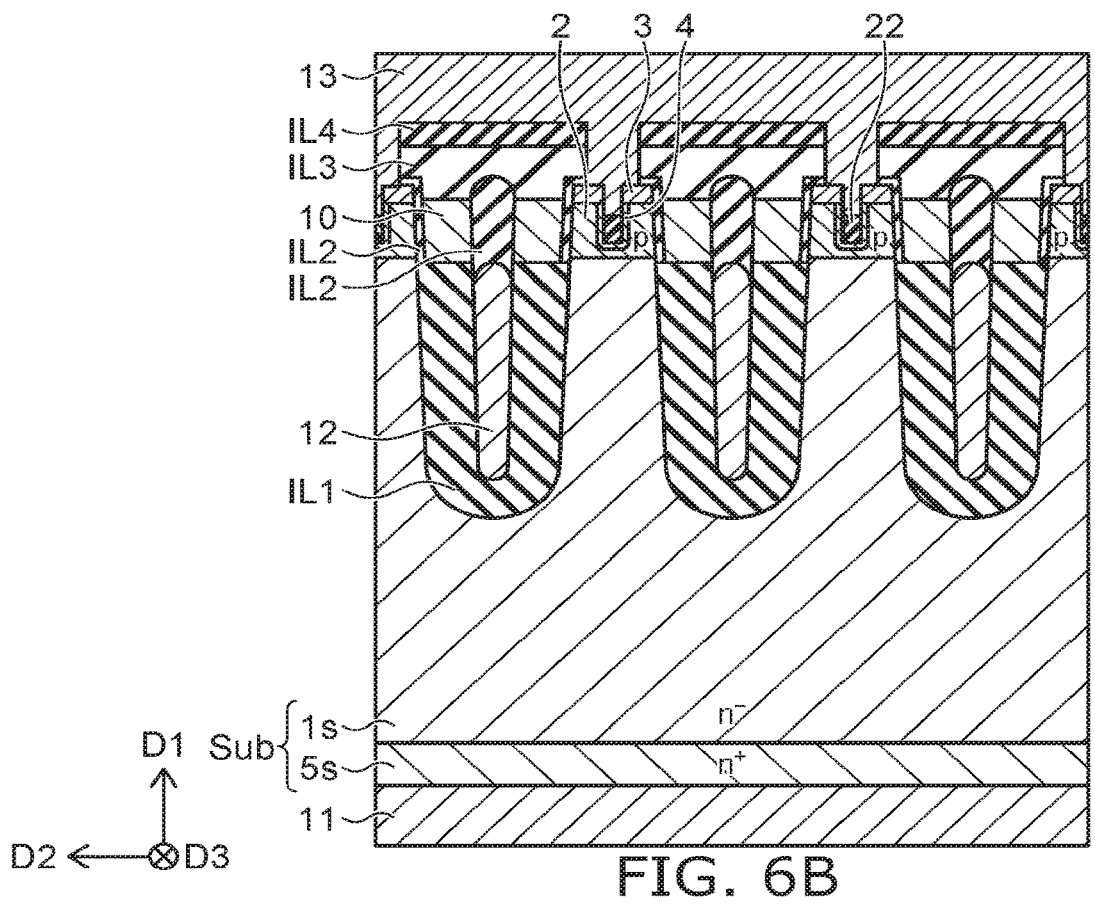

A metal layer that fills the multiple openings OP2 is formed on the insulating layer IL4. The source electrode 13 and the gate pads 14 are formed by patterning the metal layer. The back surface of the n$^+$-type semiconductor layer 5s is polished until the n$^+$-type semiconductor layer 5s has a prescribed thickness. Subsequently, as illustrated in FIG. 6B, the drain electrode 11 is formed at the back surface of the n$^+$-type semiconductor layer 5s. By the processes recited above, the semiconductor device 100 illustrated in FIG. 1 and FIG. 2 is manufactured.

CVD or sputtering can be used to form the components in the manufacturing processes described above. Isotropic etching such as wet etching, chemical dry etching (CDE), etc., or anisotropic etching such as reactive ion etching (RIE), ion beam etching (IBE), etc., can be used to remove the portions of the components. Wet etching, CDE, or chemical mechanical polishing (CMP) can be used to cause the upper surfaces of the components to recede.

Effects of the first embodiment will now be described with reference to FIGS. 7A and 7B.

FIG. 7A is a cross-sectional view illustrating a portion of the semiconductor device according to the embodiment. FIG. 7B is a graph illustrating characteristics of the semiconductor devices according to the embodiment and a reference example.

FIG. 7B illustrates simulation results of the tensile stress along line B1-B2 of FIG. 7A. In FIG. 7B, the horizontal axis is the magnitude of the tensile stress, and the vertical axis is the position in the first direction D1. In FIG. 7B, the solid line illustrates the stress in the semiconductor device 100 according to the embodiment, and the broken line illustrates the stress in a semiconductor device 100r according to the reference example. In the semiconductor device 100r according to the reference example, the second insulating part 22 is not provided, and the contact part 13a is provided instead of the second insulating part 22.

As illustrated in FIG. 7B, a large tensile stress is generated at a position arranged in the second direction D2 with the first insulating part 21. When the stress is applied from the first insulating part 21 to the n⁻-type drift region 1, tensile strain is generated along the first direction D1 in the n⁻-type drift region 1. When the semiconductor device 100 is in the ON-state, the carriers flow along the first direction D1. In other words, the tensile strain is generated along the direction in which the carriers flow. When the tensile strain is generated along the direction in which the carriers flow, the mobility of the carriers improves. In other words, the ON-resistance of the semiconductor device 100 can be reduced by the tensile strain.

The inventor discovered from the results illustrated in FIG. 7B that although a large tensile stress is generated in the n⁻-type drift region 1 arranged with the first insulating part 21, the stress is much smaller in the p-type base region 2 arranged with the gate electrode 10. To further reduce the ON-resistance of the semiconductor device 100, it is favorable to increase the tensile stress in the p-type base region 2.

Based on this knowledge, the second insulating part 22 is provided in the semiconductor device 100 according to the first embodiment. The second insulating part 22 is positioned between the n⁻-type drift region 1 and the contact part 13a in the first direction D1 and is arranged with the gate electrode 10 in the second direction D2. By providing the second insulating part 22, a larger tensile stress can be applied to the p-type base region 2 between the gate electrode 10 and the second insulating part 22 as illustrated in FIG. 7B. Thereby, a larger tensile strain is generated along the first direction D1 in the p-type base region 2. As a result, the ON-resistance of the semiconductor device 100 according to the embodiment can be reduced more than the ON-resistance of the semiconductor device 100r according to the reference example.

The second insulating part 22 may include an oxide or may include a nitride. The second insulating part 22 may include an oxynitride.

For example, in the case where the second insulating part 22 includes silicon nitride, the silicon nitride is formed by catalyst CVD using monosilane, ammonia, and nitrogen. In such a case, the density of the hydrogen included in the silicon nitride increases at the flow rate of monosilane increases. Also, the density of the hydrogen included in the silicon nitride increases as the temperature of the substrate decreases and the gas pressure decreases. The compressive stress of the silicon nitride layer can be increased by increasing the hydrogen density.

It is favorable for the second insulating part 22 to include an oxide to further increase the stress applied from the second insulating part 22 to the p-type base region 2. Typically, the volume of an oxide expands greatly when forming. The second insulating part 22 that has a high compressive stress can be formed thereby. The tensile strain that is generated in the p-type base region 2 increases as the compressive stress of the second insulating part 22 is increased. Therefore, the ON-resistance of the semiconductor device 100 can be reduced further.

The semiconductor device 100 includes a parasitic bipolar transistor (hereinbelow, called the parasitic transistor) in which the n⁻-type drift region 1 is a collector, the p-type base region 2 is a base, and the n⁺-type source region 3 is an emitter. For example, a large amount of holes flows in the p-type base region 2 when the semiconductor device 100 is switched from the ON-state to the OFF-state and avalanche breakdown occurs. The holes that flow toward the p-type base region 2 are ejected to the source electrode 13 via the contact part 13a. There is a possibility that the parasitic transistor may operate if the potential of the p-type base region 2 increases when the holes flow in the p-type base region 2. If the parasitic transistor operates, there is a possibility that a large current may flow in the semiconductor device 100 and breakdown of the semiconductor device 100 may occur. To suppress the operation of the parasitic transistor, it is favorable for the electrical resistance for the holes to be low when ejecting the holes to the source electrode 13. By reducing the electrical resistance for the holes, a voltage drop when the holes flow to the source electrode 13 can be suppressed, and the increase of the potential of the p-type base region 2 can be suppressed.

In the semiconductor device 100, the p⁺-type contact region 4 is provided on the p-type base region 2. The holes that flow toward the p-type base region 2 flow toward the contact part 13a via the p⁺-type contact region 4. The p-type impurity concentration in the p⁺-type contact region 4 is greater than the p-type impurity concentration in the p-type base region 2. Therefore, the electrical resistance for the holes in the p⁺-type contact region 4 is less than the electrical resistance for the holes in the p-type base region 2. By providing the p⁺-type contact region 4, the electrical resistance for the holes can be reduced.

In particular, in the semiconductor device 100, the p⁺-type contact region 4 is provided between the p-type base region 2 and the second insulating part 22 and between the p-type base region 2 and the contact part 13a. In other words, the p⁺-type contact region 4 is provided not only around the contact part 13a but also around the second insulating part 22. According to this configuration, the holes that flow toward the bottom portion vicinity of the second insulating part 22 flow toward the contact part 13a via the p⁺-type contact region 4. Accordingly, compared to the case where the p⁺-type contact region 4 is provided only around the contact part 13a, the electrical resistance for the holes can be reduced. As a result, the operation of the parasitic transistor in the semiconductor device 100 can be suppressed, and the likelihood of breakdown of the semiconductor device 100 when avalanche breakdown occurs can be reduced.

Modifications

Figure 8:
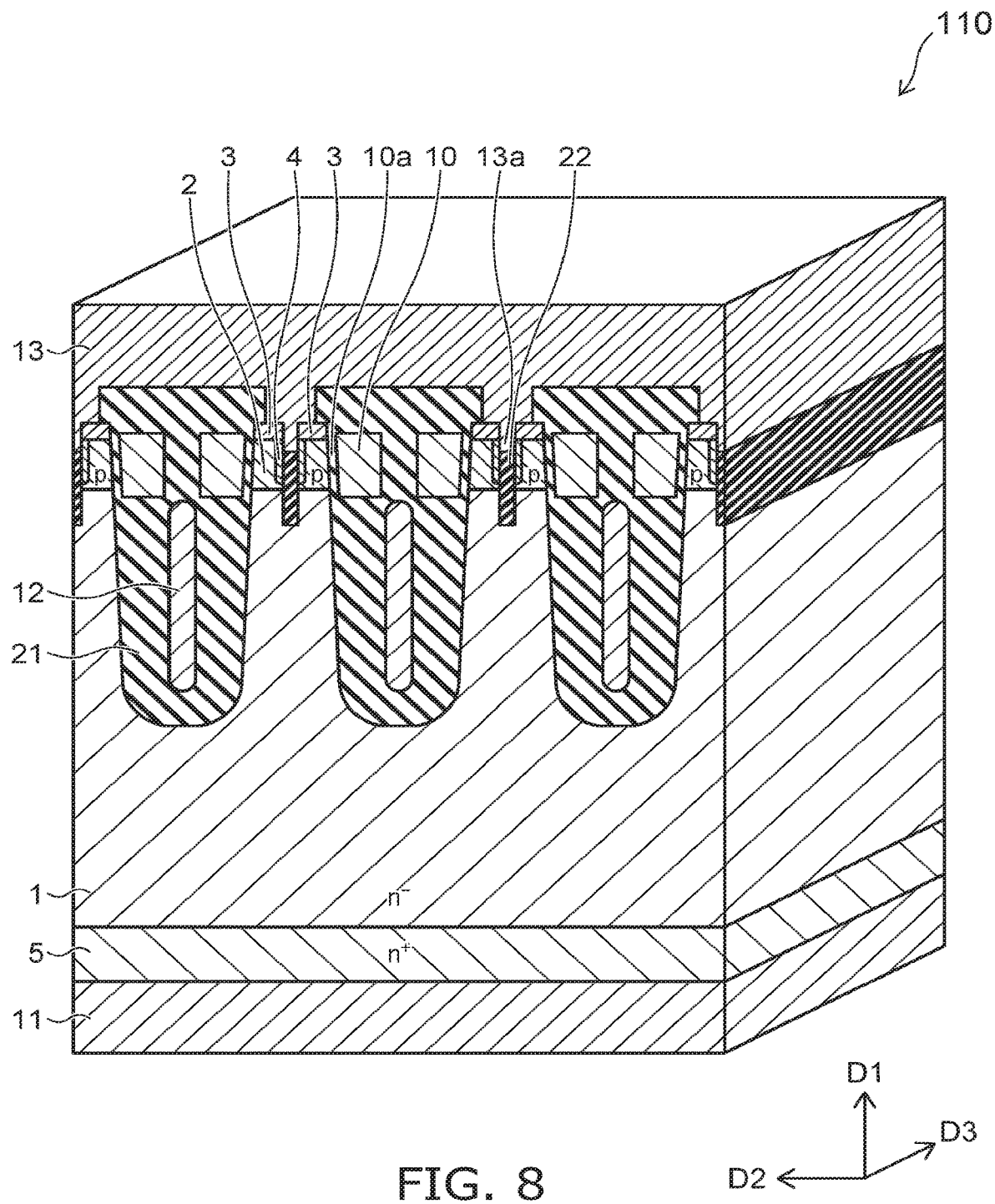
FIG. 8 is a perspective cross-sectional view illustrating portions of semiconductor devices according to modifications of the first embodiment.
Figure 9:
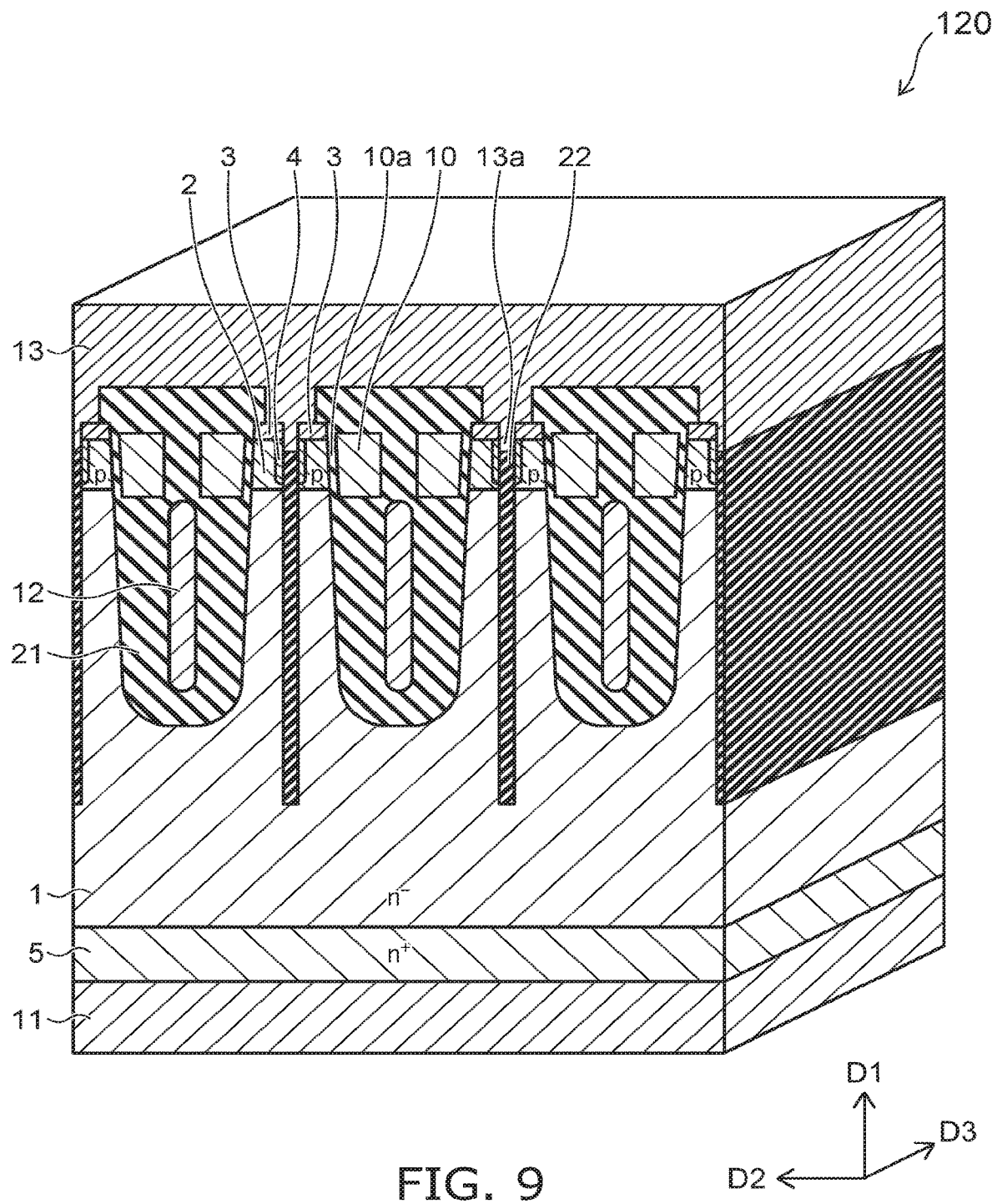
FIG. 9 is a perspective cross-sectional view illustrating portions of semiconductor devices according to modifications of the first embodiment.

FIG. 8 and FIG. 9 are perspective cross-sectional views illustrating portions of semiconductor devices according to modifications of the first embodiment.

In a semiconductor device 110 illustrated in FIG. 8, the lower end of the second insulating part 22 is positioned lower than the interface between the n⁻-type drift region 1 and the p-type base region 2. In a semiconductor device 120 illustrated in FIG. 9, the lower end of the second insulating part 22 is positioned lower than the lower end of the first insulating part 21.

The tensile strain can be generated in a wider area of the n⁻-type drift region 1 by positioning the lower end of the second insulating part 22 lower. Thereby, the ON-resistance of the semiconductor device can be reduced further.

However, when the lower end of the second insulating part 22 is positioned lower than the interface between the n⁻-type drift region 1 and the p-type base region 2, the surface area of the p-n junction surface between the n⁻-type drift region 1 and the p-type base region 2 decreases. When the surface area of the p-n junction surface decreases, the voltage that is applied per unit area of the p-n junction surface when the semiconductor device is in the OFF-state increases. There is a possibility that the breakdown voltage may be reduced thereby. Also, the width of the current path in the n⁻-type drift region 1 is narrow when the lower end of the second insulating part 22 is positioned lower than the p-n junction surface. Therefore, the reduction effect of the ON-resistance due to the tensile strain weakens.

Considering both the ON-resistance and the breakdown voltage of the semiconductor device, it is favorable for the lower end of the second insulating part 22 to be positioned higher than the p-n junction surface. According to this configuration, the ON-resistance of the semiconductor device can be reduced effectively while suppressing the reduction of the breakdown voltage of the semiconductor device. Also, it is easy to form the second insulating part 22, and the yield of the semiconductor device also can be improved.

Figure 10:
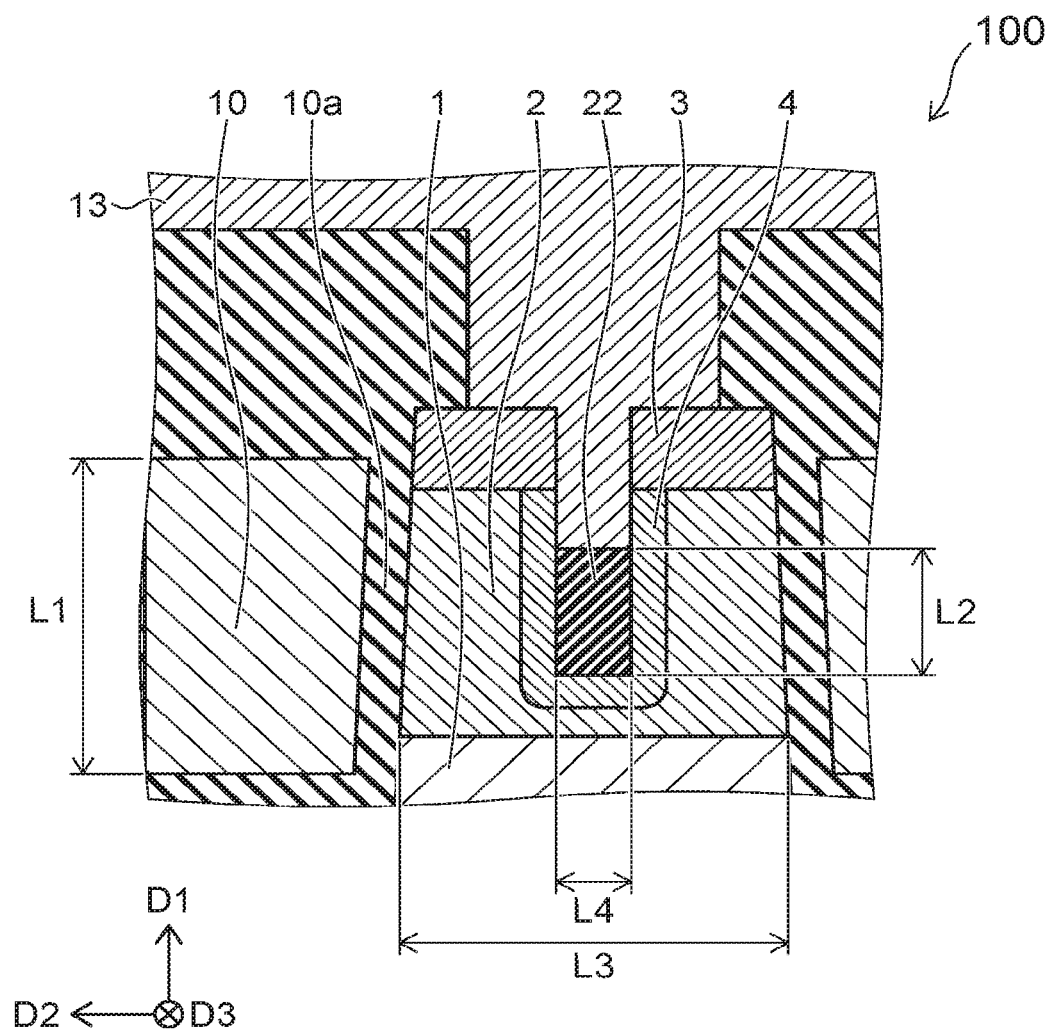
FIG. 10 is an enlarged cross-sectional view of a portion of the semiconductor device according to the first embodiment.

FIG. 10 is an enlarged cross-sectional view of a portion of the semiconductor device according to the first embodiment.

Here, an example of a favorable length relationship is described. FIG. 10 illustrates the vicinity of the second insulating part 22 and the gate electrode 10 of the semiconductor device 100.

It is favorable for the ratio of a length L2 in the first direction D1 of the second insulating part 22 to a length L1 in the first direction D1 of the gate electrode 10 to be not less than 0.2 and not more than 0.8. When the ratio is less than 0.2, the tensile strain that is generated in the p-type base region 2 is small, and a sufficient reduction effect of the ON-resistance is not obtained. On the other hand, when the ratio is greater than 0.8, the contact area between the p-type base region 2 (the p⁺-type contact region 4) and the contact part 13a is excessively small. As a result, there is a possibility that the potential of the p-type base region 2 may be unstable. For example, there is a possibility that the potential of the p-type base region 2 may increase easily, and the parasitic transistor may operate easily.

The ratio of a length L4 in the second direction D2 of the second insulating part 22 to a length L3 in the second direction D2 of the p-type base region 2 is not less than 0.2 and not more than 0.6. When the ratio is less than 0.2, the tensile strain that is generated in the p-type base region 2 is small, and a sufficient reduction effect of the ON-resistance is not obtained. On the other hand, when the ratio is greater than 0.6, the length in the second direction D2 of the p-type base region 2 between the gate insulating layer 10a and the second insulating part 22 is excessively short. There is a possibility that the region where the channel is formed when the semiconductor device is in the ON-state may be limited, and a sufficient reduction effect of the ON-resistance may not be obtained.

Second Embodiment

Figure 11:
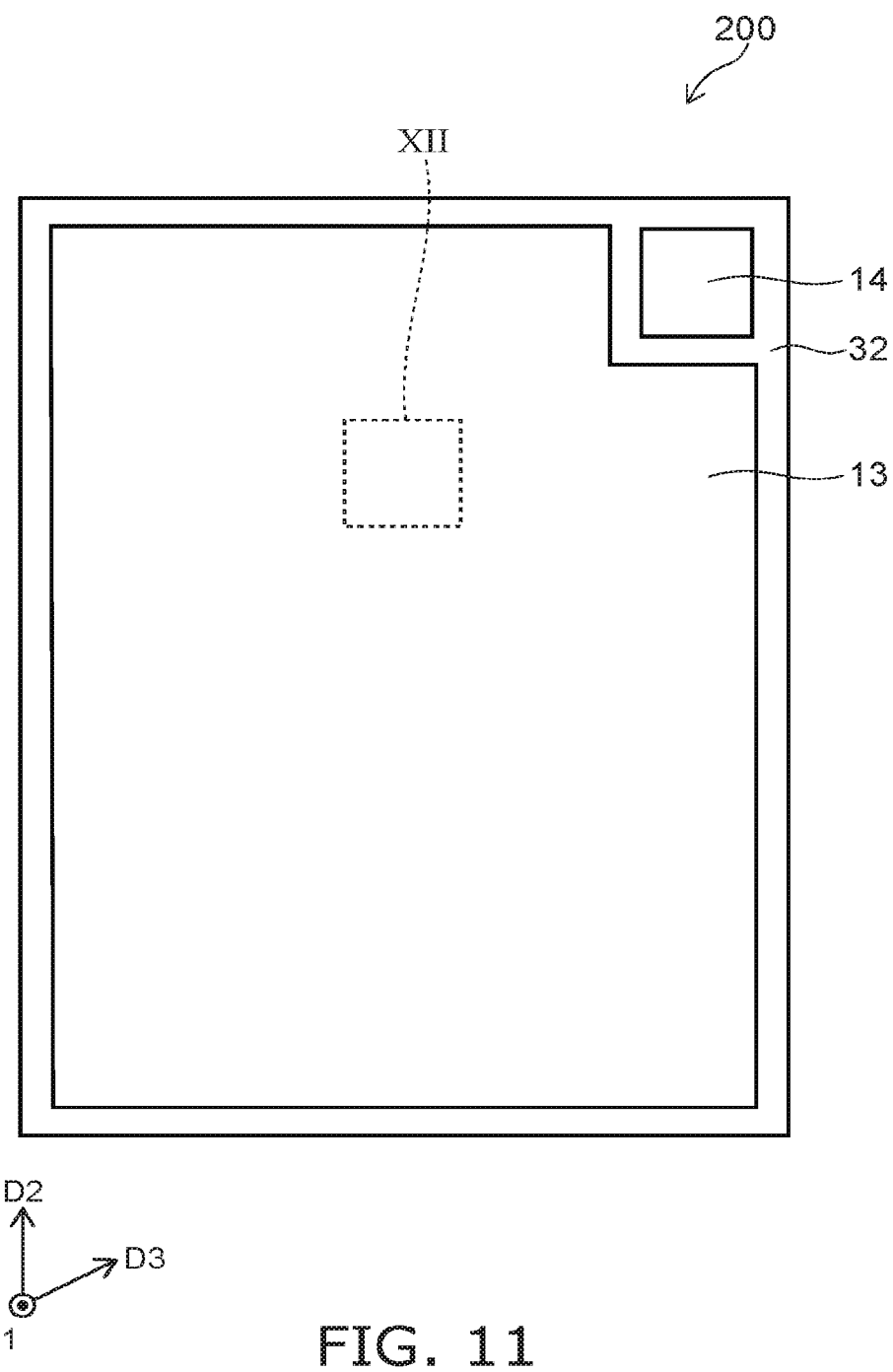
FIG. 11 is a plan view illustrating a semiconductor device according to a second embodiment.

FIG. 11 is a plan view illustrating a semiconductor device according to a second embodiment.

Figure 12:
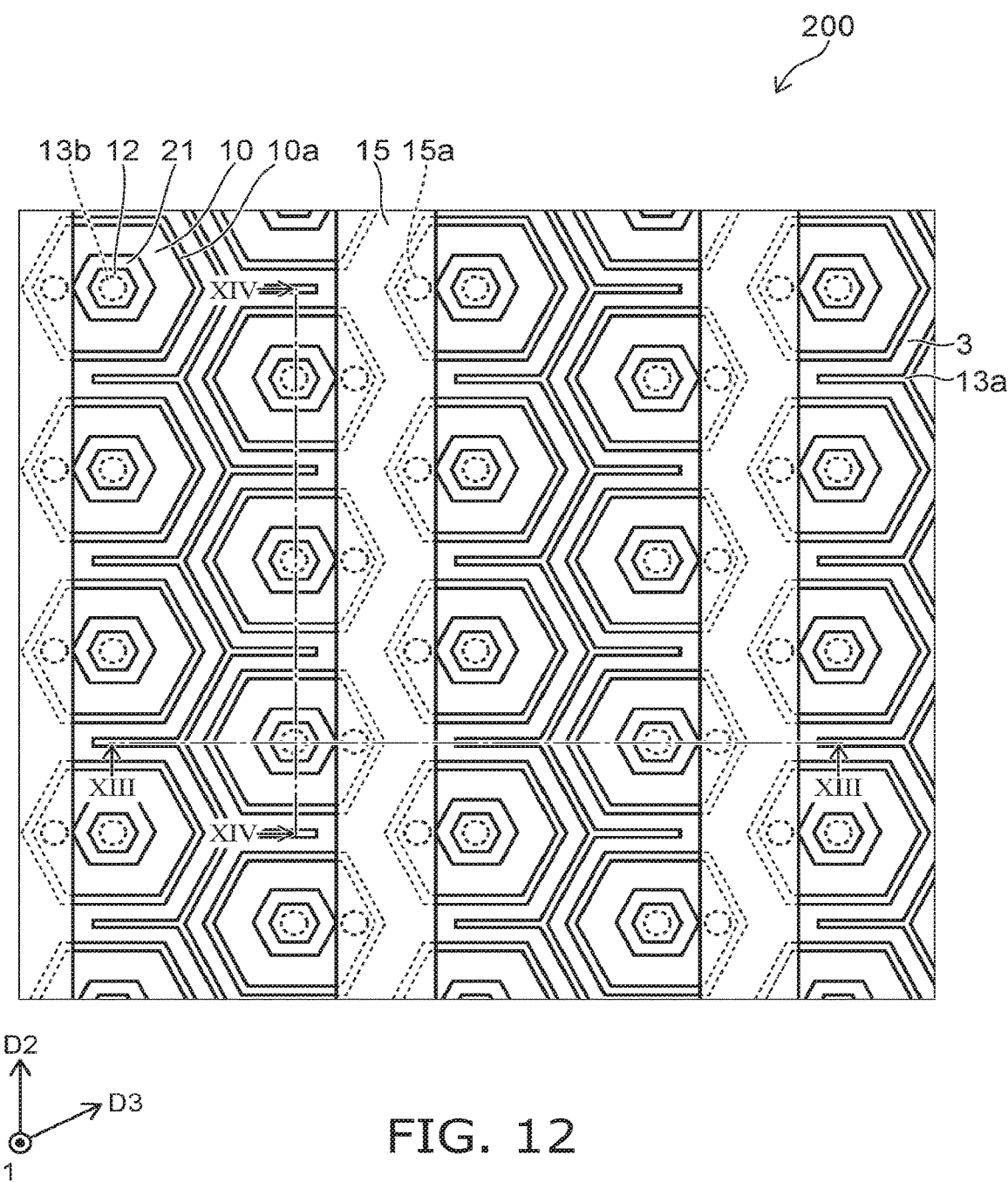
FIG. 12 is a plan view illustrating portion XII of FIG. 11.

FIG. 12 is a plan view illustrating portion XII of FIG. 11. The source electrode 13, an insulating layer 31, and an insulating layer 32 are not illustrated in FIG. 12.

Figure 13:
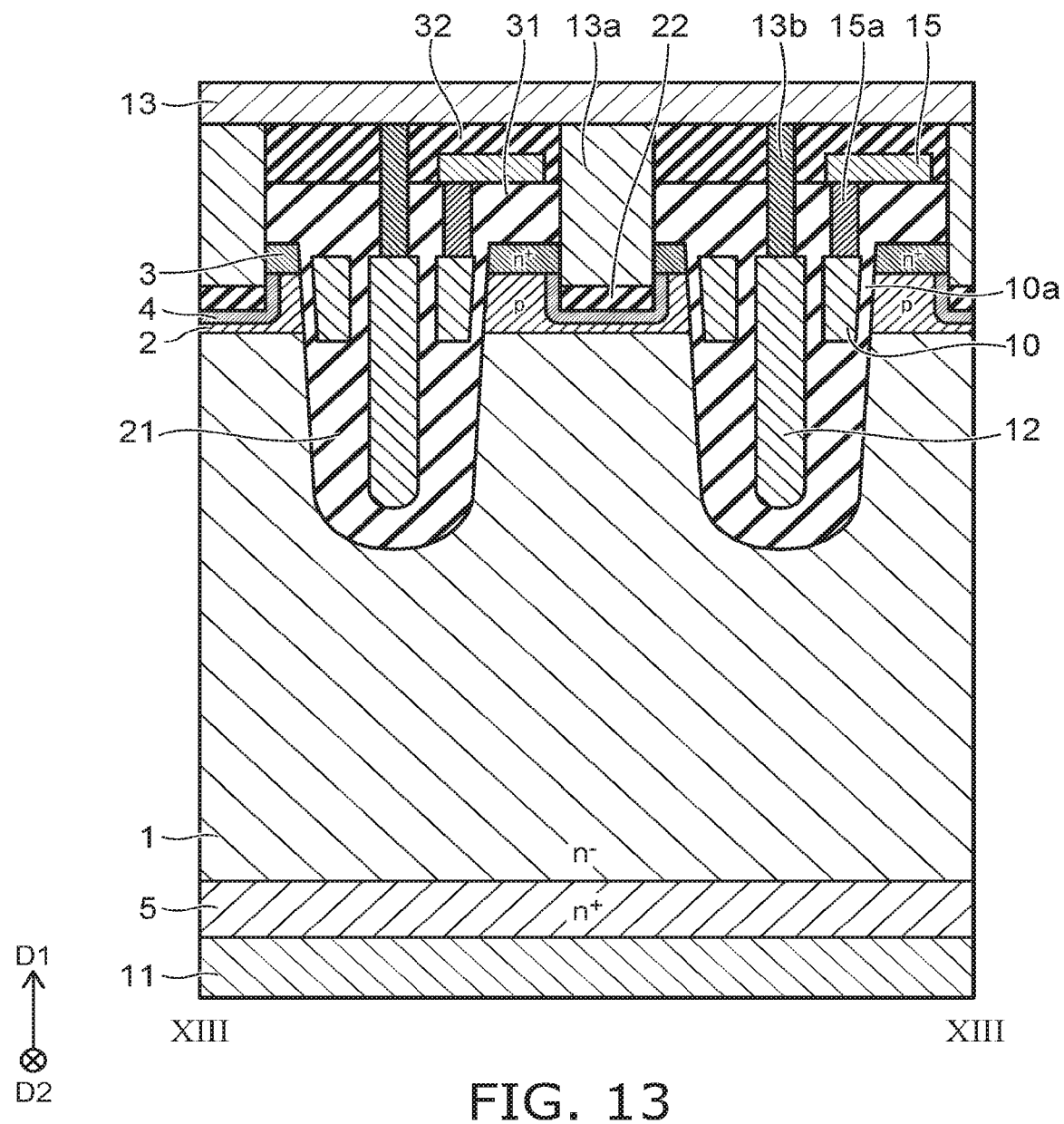
FIG. 13 is a XIII-XIII cross-sectional view of FIG. 12.
Figure 14:
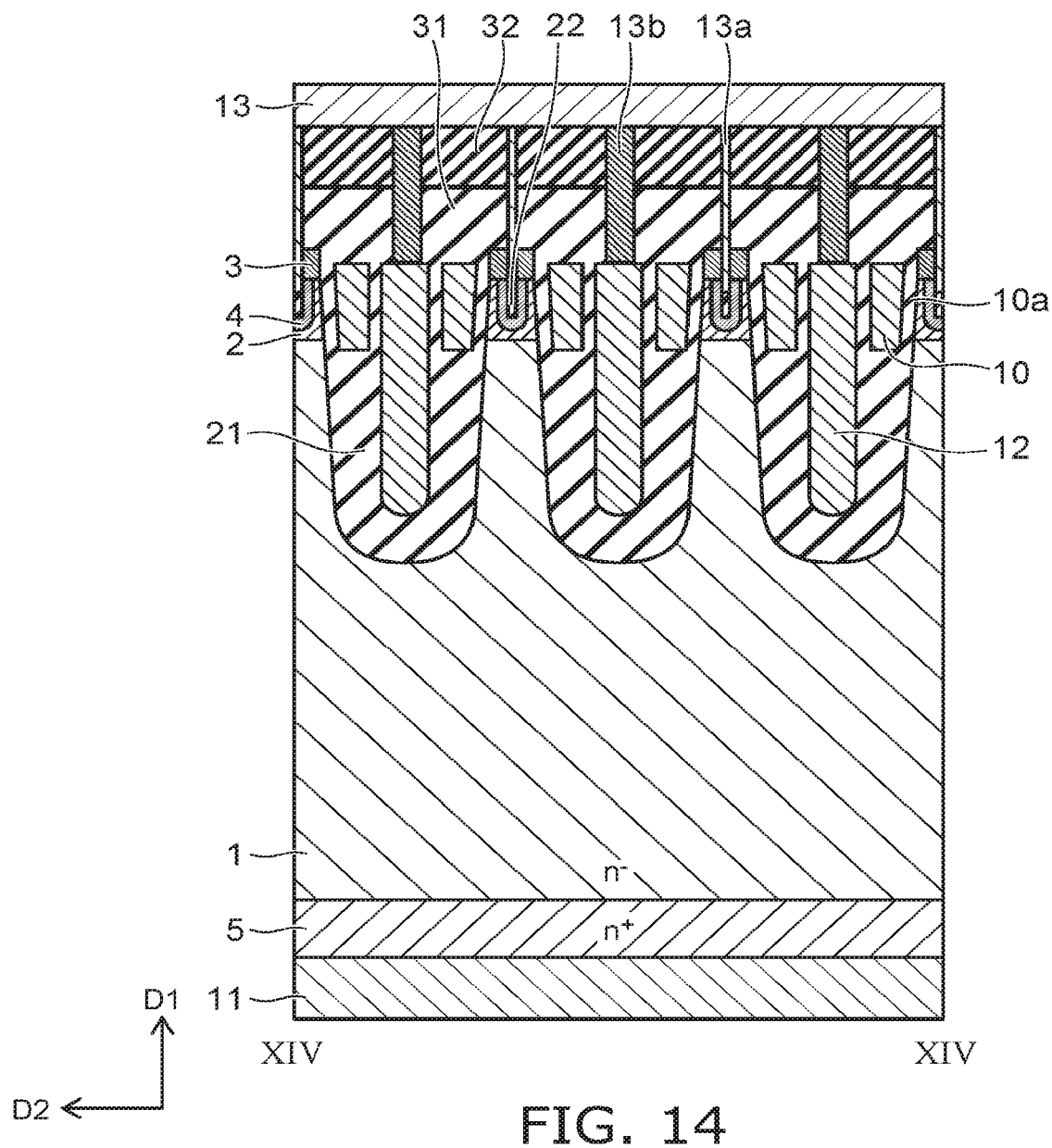
FIG. 14 is a XIV-XIV cross-sectional view of FIG. 12.

FIG. 13 is a XIII-XIII cross-sectional view of FIG. 12.
FIG. 14 is a XIV-XIV cross-sectional view of FIG. 12.

Compared to the semiconductor device 100, the semiconductor device 200 according to the second embodiment further includes a gate interconnect layer 15, the insulating layer 31, and the insulating layer 32.

In the semiconductor device 200 as illustrated in FIG. 12 to FIG. 14, a plurality is provided in the second direction D2 and the third direction D3 for each of the gate electrode 10, the FP electrode 12, and the first insulating part 21. When viewed along the first direction D1 as illustrated in FIG. 12, the gate electrode 10 is ring-shaped. The FP electrode 12 is positioned inside the gate electrode 10. The p-type base region 2, the n⁺-type source regions 3, the p⁺-type contact region 4, and the second insulating part 22 are provided around each first insulating part 21 in the second direction D2 and the third direction D3. In other words, the p-type base region 2, the pair of n⁺-type source regions 3, the p⁺-type contact region 4, and the second insulating part 22 are provided between the first insulating parts 21 next to each other in the second direction D2 and the third direction D3.

As illustrated in FIG. 13, the gate interconnect layer 15 is provided on the gate electrode 10 with the insulating layer 31 interposed. The gate interconnect layer 15 is electrically connected to the gate electrode 10 via a contact part 15a provided between the gate electrode 10 and the gate interconnect layer 15. The source electrode 13 is provided on the gate interconnect layer 15 with the insulating layer 32 interposed. The source electrode 13 is electrically connected to the FP electrode 12 via a contact part 13b provided between the FP electrode 12 and the source electrode 13. The contact part 13a exists at a position where the gate interconnect layer 15 is not provided and electrically connects the n⁺-type source regions 3 and the p⁺-type contact region 4 to the source electrode 13.

As illustrated in FIG. 12, multiple gate interconnect layers 15 are provided in the third direction D3, and the gate interconnect layers 15 extend in the second direction D2. Each of the gate interconnect layers 15 is provided on the gate electrodes 10 arranged in the second direction D2 and is electrically connected to the multiple gate electrodes 10 arranged in the second direction D2. As illustrated in FIG. 13, the source electrode 13 is provided on the multiple gate interconnect layers 15 with the insulating layer 32 interposed.

For example, as illustrated in FIG. 11, the gate pad 14 is provided on the insulating layer 32 and is separated from the source electrode 13. The gate interconnect layer 15 and the gate pad 14 are electrically connected to each other by a not-illustrated connector passing through the insulating layer 32. Or, the gate pad 14 may be provided on the insulating layer 31. In such a case, the gate pad 14 is positioned lower than the source electrode 13.

For example, the components include the following materials.

The insulating layers 31 and 32 include insulating materials such as silicon oxide, silicon nitride, etc.

The contact parts 13a, 13b, and 15a include metals such as tungsten, etc. The portion of the source electrode 13 other than the contact parts 13a and 13b includes a metal such as aluminum, copper, etc.

In the semiconductor device 200 according to the second embodiment as well, the second insulating part 22 is provided as illustrated in FIG. 13 and FIG. 14. Therefore, tensile stress can be applied to the p-type base region 2 between the gate electrode 10 and the second insulating part 22. The ON-resistance of the semiconductor device 200 can be reduced thereby.

Also, according to the second embodiment, multiple gate electrodes 10 are provided in the second direction D2 and the third direction D3. According to this structure, compared to the semiconductor device according to the first embodiment, the volume of the n⁻-type drift region 1 used as the current path can be increased. Also, channels are formed at the peripheries of the gate electrodes 10 when the semiconductor device 200 is in the ON-state. Compared to the semiconductor device 100, the surface area of the channel per unit area can be increased.

According to the second embodiment, the ON-resistance of the semiconductor device 200 can be reduced by the increase of the volume of the n⁻-type drift region 1 and the increase of the channel surface area.

In the semiconductor device 200, the first insulating part 21 is hexagonal when viewed along the first direction D1. For example, the gate electrode 10 and the FP electrode 12 also are hexagonal to correspond to the shape of the first insulating part 21. The first insulating parts 21 are arranged in a honeycomb configuration to be most dense in a plane perpendicular to the first direction D1. Because the first insulating parts 21 have the most dense arrangement, the width of the n⁻-type drift region 1 positioned between the first insulating parts 21 can be more uniform. Thereby, the breakdown voltage of the semiconductor device 200 can be increased further.

Modifications

Figure 15:
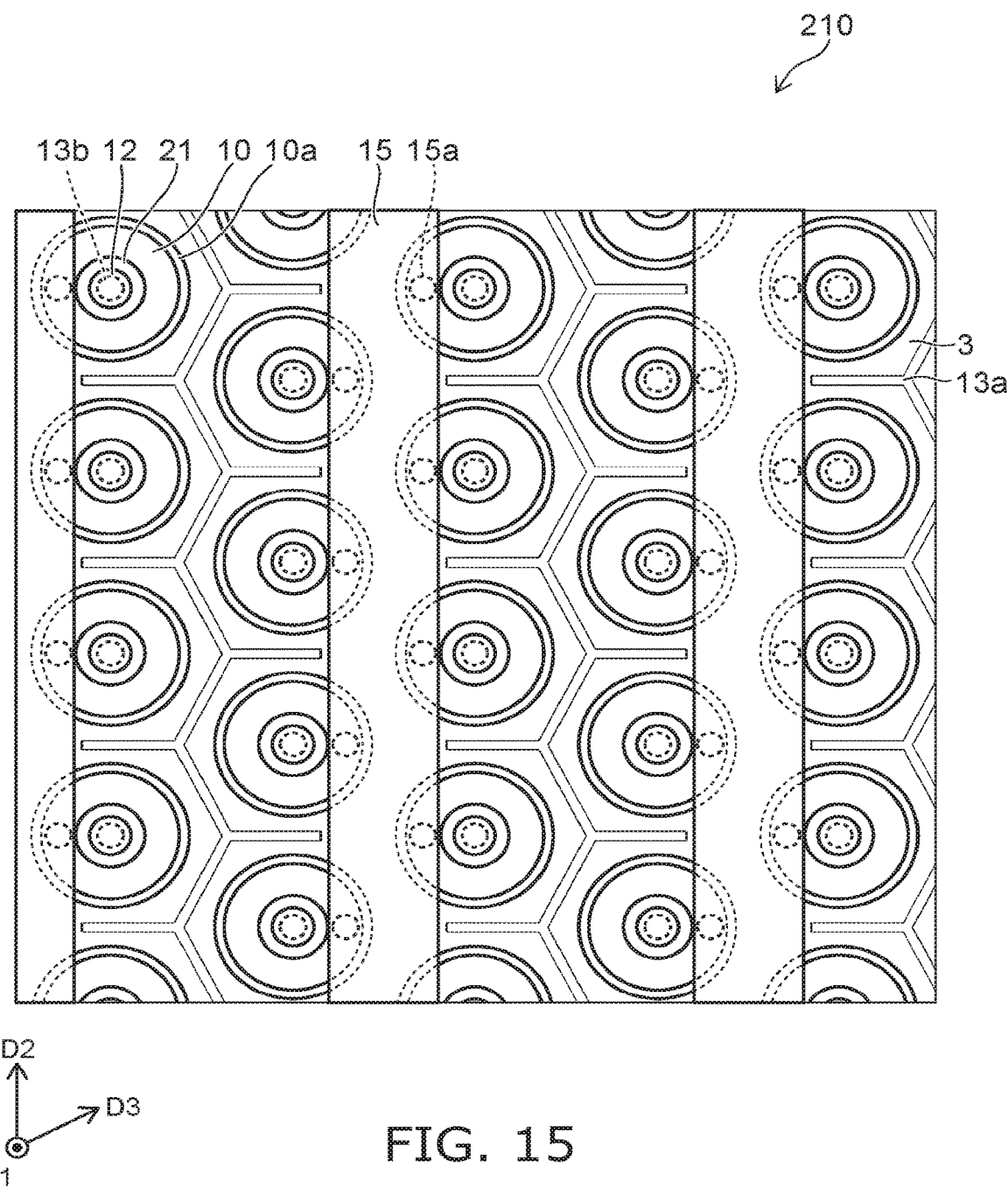
FIG. 15 is a plan view illustrating portions of semiconductor devices according to modifications of the second embodiment.
Figure 16:
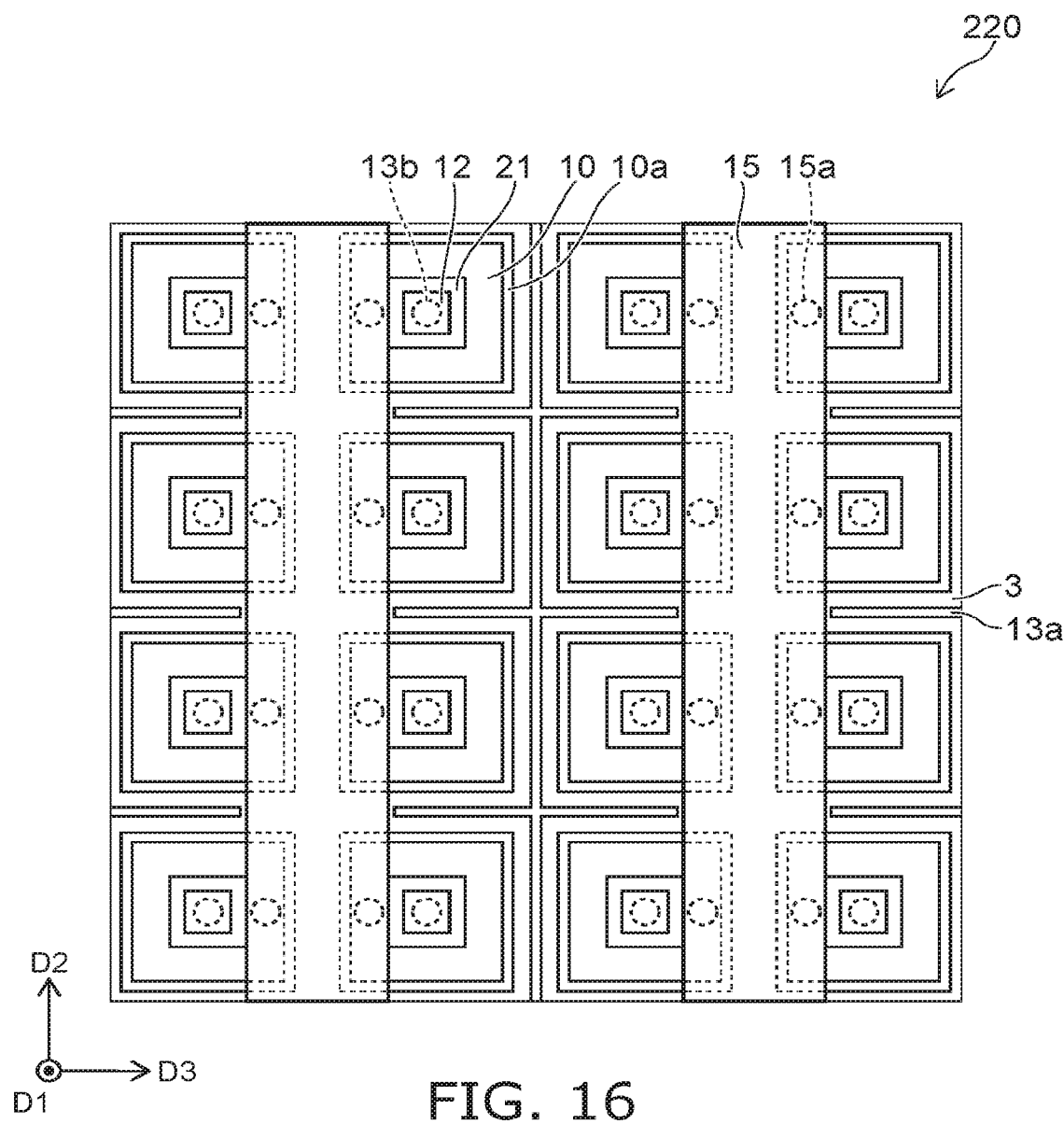
FIG. 16 is a plan view illustrating portions of semiconductor devices according to modifications of the second embodiment.

FIG. 15 and FIG. 16 are plan views illustrating portions of semiconductor devices according to modifications of the second embodiment.

In a semiconductor device 210 illustrated in FIG. 15, the first insulating part 21 is circular when viewed along the first direction D1. In a semiconductor device 220 illustrated in FIG. 16, the first insulating part 21 is quadrilateral when viewed along the first direction D1. Also, in the semiconductor device 210, the second direction D2 and the third direction D3 which are the arrangement directions of the first insulating part 21 are not orthogonal to each other. Conversely, in the semiconductor device 220, the first insulating parts 21 are arranged in the second direction D2 and the third direction D3 that are orthogonal to each other. Thus, the configurations and the arrangements of the gate electrode 10, the FP electrode 12, and the first insulating part 21 are modifiable as appropriate. In each configuration as well, the second insulating part 22 is provided at a position arranged in the second direction D2 with the gate electrode 10. The ON-resistance of the semiconductor device can be reduced thereby.

In each of the embodiments described above, it is possible to confirm the relative levels of the impurity concentrations between the semiconductor regions by using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM. It is also possible to measure the impurity concentration in each semiconductor region by, for example, SIMS (secondary ion mass spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A semiconductor device, comprising:
a first electrode;
a first semiconductor region provided on the first electrode, the first semiconductor region being of a first conductivity type;
a second semiconductor region provided on the first semiconductor region, the second semiconductor region being of a second conductivity type;
a plurality of third semiconductor regions provided selectively on the second semiconductor region, the plurality of third semiconductor regions being of the first conductivity type;
a first insulating part arranged in a second direction with the third semiconductor region, the second semiconductor region, and a portion of the first semiconductor region, the second direction being perpendicular to a first direction, the first direction being from the first electrode toward the first semiconductor region;
a second electrode provided inside the first insulating part, the second electrode including a portion opposing the first semiconductor region in the second direction;
a gate electrode provided inside the first insulating part and electrically isolated from the second electrode, the gate electrode opposing the second semiconductor region in the second direction;
a third electrode provided on the second semiconductor region and the plurality of third semiconductor regions and electrically connected to the second semiconductor region, the plurality of third semiconductor regions, and the second electrode, the third electrode including a contact part provided between the third semiconductor regions in the second direction;
a second insulating part provided between the first semiconductor region and the contact part in the first direction and arranged with the gate electrode in the second direction; and
a fourth semiconductor region provided between the second semiconductor region and the second insulating part, the fourth semiconductor region being of the second conductivity type, an impurity concentration of the second conductivity type in the fourth semiconductor region being greater than an impurity concentration of the second conductivity type in the second semiconductor region, a portion of the second semiconductor region and a portion of the fourth semiconductor region being positioned between the first semiconductor region and the second insulating part in the first direction.

2. The device according to claim 1, wherein a lower end of the second insulating part is positioned higher than an interface between the first semiconductor region and the second semiconductor region.

3. The device according to claim 2, wherein the fourth semiconductor region is further provided between the second semiconductor region and the contact part, the fourth semiconductor region being of the second conductivity type.

4. The device according to claim 1, wherein
a plurality of the first insulating parts, a plurality of the gate electrodes, and a plurality of the second electrodes are provided in the second direction, and the second semiconductor region, the plurality of third semiconductor regions, and the second insulating part are provided between the first insulating parts next to each other in the second direction.

5. The device according to claim 1, wherein
a plurality of the first insulating parts, a plurality of the gate electrodes, and a plurality of the second electrodes are provided in the second direction and a third direction, the third direction being perpendicular to the first direction and crossing the second direction, and
the second semiconductor region, the plurality of third semiconductor regions, and the second insulating part are provided between the first insulating parts next to each other in the second direction and between the first insulating parts next to each other in the third direction.

6. The device according to claim 1, wherein a ratio of a length in the first direction of the second insulating part to a length in the first direction of the gate electrode is not less than 0.2 and not more than 0.8.

7. The device according to claim 1, wherein a ratio of a length in the second direction of the second insulating part to a length in the second direction of the second semiconductor region is not less than 0.2 and not more than 0.6.

8. The device according to claim 1, wherein the second insulating part includes an oxide.

9. The device according to claim 1, wherein a lower end of the second insulating part is positioned higher than a lower end of the gate electrode.

10. The device according to claim 1, wherein an upper end of the second insulating part is positioned lower than an upper end of the gate electrode.

11. The device according to claim 1, wherein an upper end of the second insulating part is positioned lower than an interface between the second semiconductor region and the third semiconductor region.

12. The device according to claim 1, wherein a length in the second direction of the contact part is less than a length in the second direction of the gate electrode.

13. The device according to claim 1, wherein a length in the second direction of the second insulating part is less than a length in the second direction of the gate electrode.

* * * * *